(12) United States Patent
Moon et al.

(10) Patent No.: US 7,873,140 B2
(45) Date of Patent: Jan. 18, 2011

(54) SHIFT REGISTER

(75) Inventors: Su-Hwan Moon, Gyeongsangbuk-do (KR); Ji-Eun Chae, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 32 days.

(21) Appl. No.: 12/480,340

(22) Filed: Jun. 8, 2009

(65) Prior Publication Data

US 2010/0158186 A1    Jun. 24, 2010

(30) Foreign Application Priority Data

Dec. 20, 2008    (KR) ...................... 10-2008-0130761

(51) Int. Cl.
G11C 19/00 (2006.01)
H03K 3/356 (2006.01)

(52) U.S. Cl. .............................. 377/76; 377/64; 377/69; 327/213

(58) Field of Classification Search .................. 377/64, 377/73–79, 81, 69; 327/212, 213, 217, 223
See application file for complete search history.

(56) References Cited

U.S. PATENT DOCUMENTS

| | | | |
|---|---|---|---|
| 6,970,530 B1 * | 11/2005 | Wang et al. .................... | 377/69 |
| 7,529,333 B2 * | 5/2009 | Kim et al. ...................... | 377/64 |
| 7,570,729 B2 * | 8/2009 | Jeong ........................... | 377/64 |
| 7,764,761 B2 * | 7/2010 | Shih et al. ...................... | 377/64 |

\* cited by examiner

*Primary Examiner*—Hai L Nguyen
(74) *Attorney, Agent, or Firm*—Morgan, Lewis & Bockius LLP (57) ABSTRACT

A shift register is disclosed. The shift register includes a plurality of stages for sequentially outputting scan pulses, wherein each of the stages includes a scan pulse output unit controlled according to voltage states of a set node and reset node for outputting a corresponding one of the scan pulses and supplying the corresponding scan pulse to a corresponding gate line, a carry pulse output unit controlled according to the voltage states of the set node and reset node for outputting a carry pulse and supplying it to an upstream one of the stages and a downstream one of the stages, a first node controller for controlling the voltage states of the set node and reset node according to a carry pulse from the upstream stage, a carry pulse from the downstream stage and a first control signal externally supplied thereto, an all-drive signal output unit controlled according to voltage states of a control node and reset control node for outputting an all-drive signal and supplying it to the corresponding gate line, and a second node controller for controlling the voltage states of the control node and reset control node according to the voltage state of the set node, the voltage state of the reset node, and a start pulse and second control signal externally supplied thereto.

9 Claims, 9 Drawing Sheets

SHIFT REGISTER

This application claims the benefit of Korean Patent Application No. 10-2008-0130761, filed on Dec. 20, 2008, which is hereby incorporated by reference as if fully set forth herein.

BACKGROUND OF THE INVENTION

1. Field of the Invention

The present invention relates to a shift register, and more particularly, to a shift register which is capable of simultaneously supplying all-drive signals to gate lines for an all-drive period and sequentially supplying scan pulses to the gate lines forwardly or reversely for a scan period.

2. Discussion of the Related Art

In general, a liquid crystal display device is adapted to display an image by adjusting light transmittance of a liquid crystal using an electric field. To this end, the liquid crystal display device includes a liquid crystal panel having pixel areas arranged in matrix form, and a driving circuit for driving the liquid crystal panel.

In the liquid crystal panel, a plurality of gate lines and a plurality of data lines are arranged to intersect each other, and pixel areas are located respectively in areas defined by the intersections of the gate lines and the data lines. A pixel electrode and a common electrode for application of an electric field to each of the pixel areas are formed in the liquid crystal panel.

Each pixel electrode is connected to a corresponding one of the data lines via the source terminal and drain terminal of a thin film transistor (TFT), which is a switching device. The TFT is turned on by a scan pulse applied to the gate terminal thereof via a corresponding one of the gate lines to charge a data signal from the corresponding data line in the pixel electrode.

The driving circuit includes a gate driver for driving the gate lines, a data driver for driving the data lines, a timing controller for supplying control signals for control of the gate driver and data driver, and a power supply for supplying various driving voltages to be used in the liquid crystal display device.

The gate driver includes a shift register for sequentially supplying scan pulses to the gate lines to sequentially drive pixels in the liquid crystal panel on a line-by-line basis.

On the other hand, when the liquid crystal display device is driven, it is common that the gate lines are driven in order. However, in some cases, it may be necessary to simultaneously drive the gate lines or change the driving direction of the gate lines. A conventional shift register has a disadvantage in that it cannot attain such driving.

SUMMARY OF THE INVENTION

Accordingly, the present invention is directed to a shift register that substantially obviates one or more problems due to limitations and disadvantages of the related art.

An object of the present invention is to provide a shift register which is capable of simultaneously supplying all-drive signals to gate lines for an all-drive period and sequentially supplying scan pulses to the gate lines forwardly or reversely for a scan period.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages for sequentially outputting scan pulses, wherein each of the stages includes: a scan pulse output unit controlled according to voltage states of a set node and reset node for outputting a corresponding one of the scan pulses and supplying the corresponding scan pulse to a corresponding gate line; a carry pulse output unit controlled according to the voltage states of the set node and reset node for outputting a carry pulse and supplying it to an upstream one of the stages and a downstream one of the stages; a first node controller for controlling the voltage states of the set node and reset node according to a carry pulse from the upstream stage, a carry pulse from the downstream stage and a first control signal externally supplied thereto; an all-drive signal output unit controlled according to voltage states of a control node and reset control node for outputting an all-drive signal and supplying it to the corresponding gate line; and a second node controller for controlling the voltage states of the control node and reset control node according to the voltage state of the set node, the voltage state of the reset node, and a start pulse and second control signal externally supplied thereto.

The first control signal may be maintained in a low state for an all-drive period and in a high state for a scan period, and the second control signal may be maintained in the high state for the all-drive period and in the low state for the scan period.

The first node controller of a kth one of the stages may include: a first switching device turned on or off in response to a scan pulse from a (k−1)th one of the stages, the first switching device interconnecting a first transfer line and the set node when being turned on; a second switching device turned on or off in response to a scan pulse from a (k+1)th one of the stages, the second switching device interconnecting a second transfer line and the set node when being turned on; a third switching device turned on or off in response to the first control signal from a first control line, the third switching device interconnecting the first control line and the reset node when being turned on; a fourth switching device turned on or off in response to a voltage at the set node, the fourth switching device interconnecting the reset node and a discharging voltage line when being turned on, the discharging voltage line transferring a discharging voltage; and a fifth switching device turned on or off in response to a voltage at the reset node, the fifth switching device interconnecting the set node and the discharging voltage line when being turned on.

In forward driving where the stages are driven to output the scan pulses sequentially from a first stage to a last stage, the first control signal may be supplied to the first transfer line and the discharging voltage may be supplied to the second transfer line. In reverse driving where the stages are driven to output the scan pulses reverse-sequentially from the last stage to the first stage, the discharging voltage may be supplied to the first transfer line and the first control signal may be supplied to the second transfer line.

The second node controller of the kth stage may include: a sixth switching device turned on or off in response to the start pulse and the second control signal, the sixth switching device connecting the control node to a second control signal input line when being turned on; a seventh switching device turned on or off in response to the second control signal, the seventh switching device connecting the reset control node to the second control signal input line when being turned on; an eighth switching device turned on or off in response to a voltage at the control node, the eighth switching device interconnecting the reset control node and the discharging voltage line when being turned on; a ninth switching device turned on or off in response to a voltage at the reset control node, the ninth switching device interconnecting the control node and the discharging voltage line when being turned on; a tenth switching device turned on or off in response to the voltage at the control node, the tenth switching device interconnecting the reset node and the discharging voltage line when being turned on; an eleventh switching device turned on or off in response to the voltage at the control node, the eleventh switching device interconnecting the set node and the discharging voltage line when being turned on; a twelfth switching device turned on or off in response to the voltage at the set node, the twelfth switching device interconnecting the control node and the discharging voltage line when being turned on; a thirteenth switching device turned on or off in response to the voltage at the set node, the thirteenth switching device interconnecting the reset control node and the discharging voltage line when being turned on; a fourteenth switching device turned on or off in response to the voltage at the reset control node, the fourteenth switching device interconnecting the set node and the discharging voltage line when being turned on; a fifteenth switching device turned on or off in response to the voltage at the reset control node, the fifteenth switching device interconnecting the reset node and the discharging voltage line when being turned on; a sixteenth switching device turned on or off in response to the voltage at the reset node, the sixteenth switching device interconnecting the control node and the discharging voltage line when being turned on; and a seventeenth switching device turned on or off in response to the voltage at the reset node, the seventeenth switching device interconnecting the reset control node and the discharging voltage line when being turned on.

The scan pulse output unit of the kth stage may include: a scan pull-up switching device turned on or off in response to the voltage at the set node, the scan pull-up switching device interconnecting any one of a plurality of clock transfer lines and a kth gate line when being turned on, the clock transfer lines transferring a plurality of clock pulses with different phases, respectively; and a scan pull-down switching device turned on or off in response to the voltage at the reset node, the scan pull-down switching device interconnecting the discharging voltage line and the kth gate line when being turned on.

The carry pulse output unit of the kth stage may include: a carry pull-up switching device turned on or off in response to the voltage at the set node, the carry pull-up switching device interconnecting any one of a plurality of clock transfer lines and the (k−1)th stage and (k+1)th stage when being turned on, the clock transfer lines transferring a plurality of clock pulses with different phases, respectively; and a carry pull-down switching device turned on or off in response to the voltage at the reset node, the carry pull-down switching device interconnecting the discharging voltage line and the (k−1)th stage and (k+1)th stage when being turned on.

The all-drive signal output unit of the kth stage may include: an all-drive pull-up switching device turned on or off in response to the voltage at the control node, the all-drive pull-up switching device interconnecting an all-drive clock transfer line and a kth gate line when being turned on, the all-drive clock transfer line transferring an all-drive clock pulse; and an all-drive pull-down switching device turned on or off in response to the voltage at the reset control node, the all-drive pull-down switching device interconnecting the discharging voltage line and the kth gate line when being turned on.

The start pulse may be maintained in a high state for a first drive period, of the first drive period and a second drive period constituting the all-drive period, and for an initial period, of the initial period and an actual scan period constituting the scan period, and the all-drive clock pulse may be maintained in the high state for the second drive period.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
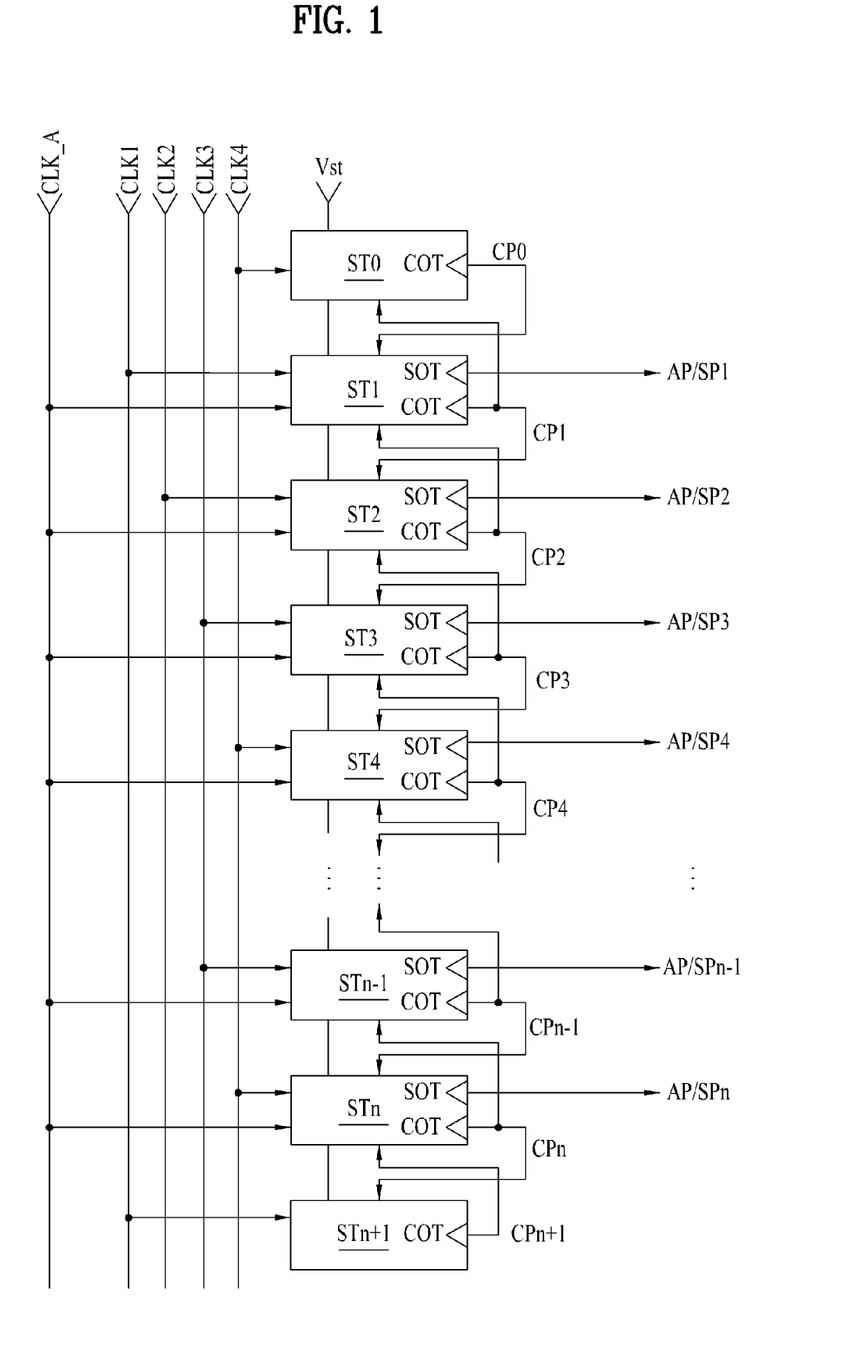
FIG. 1 is a block diagram showing the configuration of a shift register according to an exemplary embodiment of the present invention.
Figure 2:
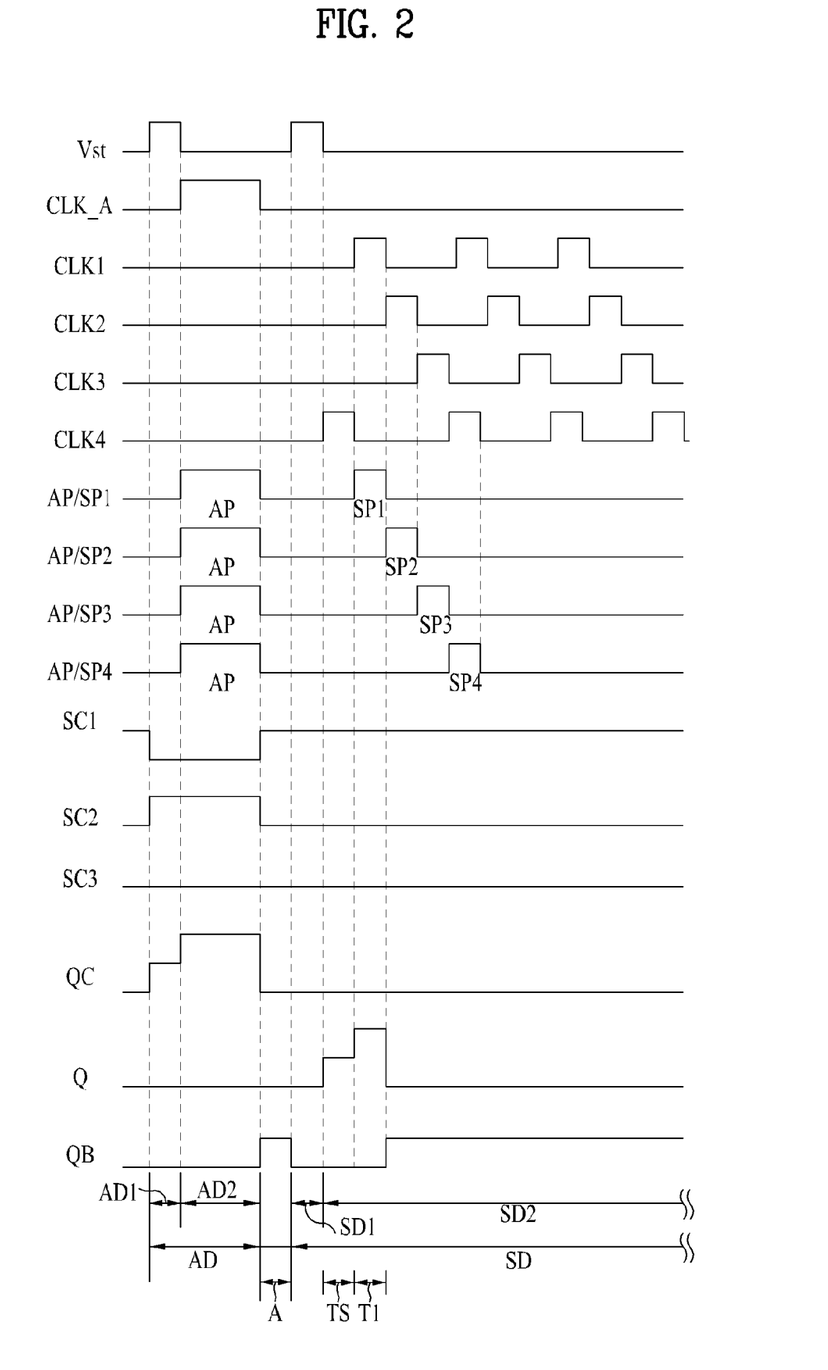
FIG. 2 is a waveform diagram of various signals which are supplied to the shift register of FIG. 1 in forward driving and all-drive signals and scan pulses which are outputted therefrom.

FIG. 1 is a block diagram showing the configuration of a shift register according to an exemplary embodiment of the present invention, and FIG. 2 is a waveform diagram of various signals which are supplied to the shift register of FIG. 1 in forward driving and all-drive signals AP and scan pulses which are outputted therefrom.

The shift register shown in FIG. 1 includes a plurality of stages for simultaneously supplying all-drive signals AP to gate lines for an all-drive period AD and sequentially supplying scan pulses to the gate lines for a scan period SD. The all-drive period AD and the scan period SD are included in one frame period.

In other words, the shift register according to the present embodiment includes n stages ST1 to STn and two dummy stages ST0 and STn+1. Each of the stages ST1 to STn outputs one scan pulse SP1 to SPn for one frame period through a scan output terminal SOT thereof and also outputs one carry pulse CP1 to CPn for the one frame period through a carry output terminal COT thereof.

The scan pulse and carry pulse outputted from one stage are the same signal. Each of the stages ST1 to STn drives a gate line connected thereto using the scan pulse and controls the operations of a stage downstream therefrom and a stage upstream therefrom using the carry pulse.

The stages ST0 to STn+1 output scan pulses SP1 to SPn and carry pulses CP0 to CPn+1 in order from the upper dummy stage ST0 to the lower dummy stage STn+1. That is, the upper dummy stage ST0 outputs an upper dummy carry pulse CP0, the first stage ST1 then outputs a first scan pulse SP1 and a first carry pulse CP1, the second stage ST2 then outputs a second scan pulse SP2 and a second carry pulse CP2, the third stage ST3 then outputs a third scan pulse SP3 and a third carry pulse CP3, the fourth stage ST4 then outputs a fourth scan pulse SP4 and a fourth carry pulse CP4, . . . , the (n−1)th stage STn−1 then outputs an (n−1)th scan pulse SPn−1 and an (n−1)th carry pulse CPn−1, the nth stage STn then outputs an nth scan pulse SPn and an nth carry pulse CPn, and the lower dummy stage STn+1 finally outputs a lower dummy carry pulse CPn+1.

Here, the upper dummy stage ST0 and the lower dummy stage STn+1 output no scan pulse, and output only the dummy carry pulses CP0 and CPn+1 as stated above. At this time, the upper dummy carry pulse CP0 outputted from the upper dummy stage ST0 is supplied to the first stage ST1 to set the first stage ST1, and the lower dummy carry pulse CPn+1 outputted from the lower dummy stage STn+1 is supplied to the nth stage STn to reset the nth stage ST.

The scan pulses outputted from the stages ST1 to STn, other than the upper and lower dummy stages ST0 and STn+1, are sequentially supplied to gate lines of a liquid crystal panel (not shown) to sequentially scan the gate lines. The carry pulse outputted from each of the stages is supplied to an upstream stage, supplied to the upstream stage and a downstream stage or supplied to the downstream stage.

This shift register may be built in the liquid crystal panel. That is, the liquid crystal panel has a display region for displaying an image, and a non-display region surrounding the display region, and the shift register is built in the non-display region.

Each of the stages of the shift register, configured in this manner, is supplied with a discharging voltage VSS, and any one of first to fourth clock pulses CLK1 to CLK4 which are outputted sequentially out of phase with one another and cyclically. Also, the first to nth stages ST1 to STn are further supplied with first to third control signals SC1 to SC3 and a start pulse Vst.

The discharging voltage VSS is provided from a discharging voltage line, the first clock pulse CLK1 is provided from a first clock transfer line, the second clock pulse CLK2 is provided from a second clock transfer line, the third clock pulse CLK3 is provided from a third clock transfer line, the fourth clock pulse CLK4 is provided from a fourth clock transfer line, and the start pulse Vst is provided from a start transfer line.

The discharging voltage VSS is a direct current (DC) voltage which is negative. On the other hand, the discharging voltage VSS may be a ground voltage. The discharging voltage VSS has the same voltage value as a low state voltage value of each of the clock pulses CLK1 to CLK4.

The clock pulses CLK1 to CLK4 are signals which are used to generate the carry pulses and scan pulses of the respective stages ST0 to STn+1. Each of the stages ST0 to STn+1 generates the corresponding carry pulse and scan pulse using any one of the clock pulses. For example, the (4 m+1)th stage, among the n stages, outputs the corresponding carry pulse and scan pulse using the first clock pulse CLK1, the (4 m+2)th stage outputs the corresponding carry pulse and scan pulse using the second clock pulse CLK2, the (4 m+3)th stage outputs the corresponding carry pulse and scan pulse using the third clock pulse CLK3, and the (4 m+4)th stage outputs the corresponding carry pulse and scan pulse using the fourth clock pulse CLK4. Here, m is a natural number including 0.

Although the four types of clock pulses having different phases are used for illustrative purposes in the present invention, any number of types of clock pulses may be used as long as they are two or more.

The first to fourth clock pulses CLK1 to CLK4 are outputted out of phase with one another. That is, the second clock pulse CLK2 is outputted after being phase-delayed by one pulse width from the first clock pulse CLK1, and the third clock pulse CLK3 is outputted after being phase-delayed by one pulse width from the second clock pulse CLK2. The fourth clock pulse CLK4 is outputted after being phase-delayed by one pulse width from the third clock pulse CLK3, and the first clock pulse CLK1 is outputted after being phase-delayed by one pulse width from the fourth clock pulse CLK4.

The first to fourth clock pulses CLK1 to CLK4 are outputted sequentially and cyclically. In other words, the first to fourth clock pulses CLK1 to CLK4 are outputted sequentially from the first clock pulse CLK1 to the fourth clock pulse CLK4 and, thereafter, again from the first clock pulse CLK1 to the fourth clock pulse CLK4. As a result, the first clock pulse CLK1 is outputted in a period between the fourth clock pulse CLK4 and the second clock pulse CLK2. Here, the fourth clock pulse CLK4 and the start pulse Vst may be outputted in synchronization with each other. In this case where the fourth clock pulse CLK4 and the start pulse Vst are in synchronization with each other, the fourth clock pulse CLK4 is outputted earliest among the first to fourth clock pulses CLK1 to CLK4.

The start pulse Vst is outputted two times for one frame period, whereas each of the clock pulses CLK1 to CLK4 is outputted several times for the one frame period. In other words, the start pulse Vst exhibits its active state (high state) two times for the one frame period, whereas each of the clock pulses CLK1 to CLK4 exhibits its active state periodically several times for the one frame period. That is, the start pulse Vst is maintained in a high state for a first drive period AD1, of the first drive period AD1 and a second drive period AD2 constituting the all-drive period AD, and for an initial period SD1, of the initial period SD1 and an actual scan period SD2 constituting the scan period SD.

On the other hand, the first to nth stages ST1 to STn, other than the upper dummy stage ST0 and lower dummy stage STn+1, are further supplied with an all-drive clock pulse CLK_A, besides the above-stated various signals. The all-drive clock pulse CLK_A is maintained in the high state for the second drive period AD2, of the first drive period AD1 and second drive period AD2 constituting the all-drive period AD.

The first control signal SC1 is maintained in a low state for the all-drive period AD and at the high state for the scan period SD. The second control signal SC2 is maintained in the high state for the all-drive period AD and at the low state for the scan period SD. The third control signal SC3 is maintained in the low state for both the all-drive period AD and scan period SD in forward gate line driving.

Figure 5:
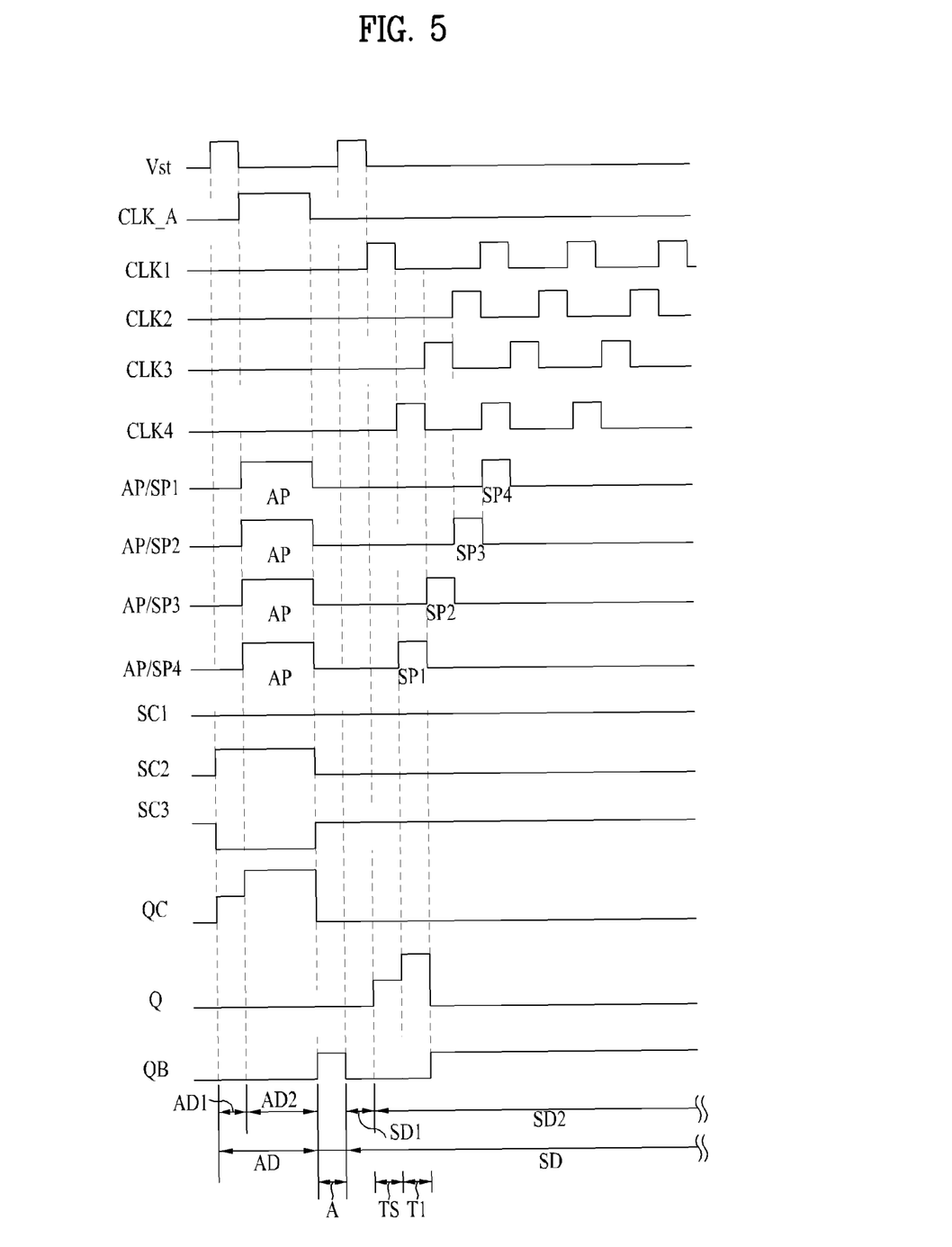
FIG. 5 is a waveform diagram of various signals which are supplied to the shift register of FIG. 1 in reverse driving and all-drive signals and scan pulses which are outputted therefrom.

In contrast, in reverse gate line driving, the third control signal SC3 is maintained in the low state for the all-drive period AD and at the high state for the scan period SD. In this reverse gate line driving, the first control signal SC1 is maintained in the low state for both the all-drive period AD and scan period SD.

Each stage in this shift register has a circuit configuration as follows.

Figure 3:
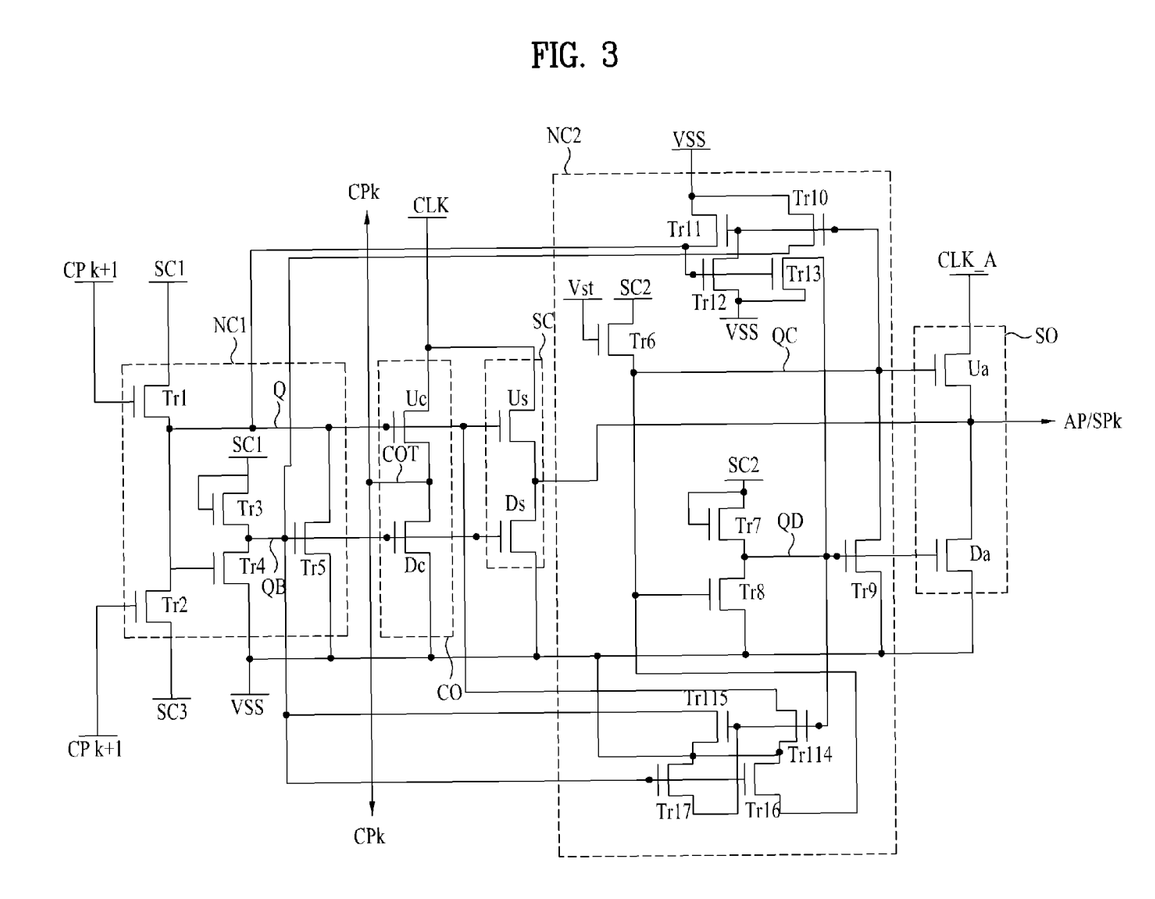
FIG. 3 is a circuit diagram of each stage in the shift register of FIG. 1.

FIG. 3 is a circuit diagram of each stage in the shift register of FIG. 1.

Each stage includes, as shown in FIG. 3, a scan pulse output unit SC, a carry pulse output unit CO, a first node controller NC1, a second node controller NC2, and an all-drive signal output unit SO.

The scan pulse output unit SC is controlled according to the voltage states of a set node Q and reset node QB to output a scan pulse SPk and supply it to a corresponding gate line.

The carry pulse output unit CO is controlled according to the voltage states of the set node Q and reset node QB to output a carry pulse CPk and supply it to an upstream stage and a downstream stage.

The first node controller NC1 controls the voltage states of the set node Q and reset node QB according to a carry pulse from the upstream stage, a carry pulse from the downstream stage and the first control signal SC1 externally supplied thereto.

The all-drive signal output unit SO is controlled according to the voltage states of a control node QC and reset control node QD to output the all-drive signal AP and supply it to the corresponding gate line.

The second node controller NC2 controls the voltage states of the control node QC and reset control node QD according to the voltage state of the set node Q, the voltage state of the reset node QB, and the start pulse Vst and second control signal SC2 externally supplied thereto.

The first node controller NC1 of a kth stage STk includes first to fifth switching devices Tr1 to Tr5.

The first switching device Tr1 is turned on or off in response to a scan pulse or carry pulse from a (k−1)th stage, and interconnects a first transfer line and the set node Q when being turned on. The first control signal SC1 is inputted to the first transfer line.

The second switching device Tr2 is turned on or off in response to a scan pulse or carry pulse from a (k+1)th stage, and interconnects a second transfer line and the set node Q when being turned on. The third control signal SC3 is inputted to the second transfer line. The inputted third control signal SC3 assumes a low state in forward driving.

The third switching device Tr3 is turned on or off in response to the first control signal SC1 from a first control line, and interconnects the first control line and the reset node QB when being turned on.

The fourth switching device Tr4 is turned on or off in response to a voltage at the set node Q, and interconnects the reset node QB and the discharging voltage line transferring the discharging voltage VSS when being turned on.

The fifth switching device Tr5 is turned on or off in response to a voltage at the reset node QB, and interconnects the set node Q and the discharging voltage line when being turned on.

In forward driving where the stages are driven to output scan pulses sequentially from the first stage ST1 to the last stage STn, the first control signal SC1 is supplied to the first transfer line and the discharging voltage VSS is supplied to the second transfer line.

In contrast, in reverse driving where the stages are driven to output scan pulses sequentially from the last stage STn to the first stage ST1, the discharging voltage VSS or the first control signal SC1 of the low state is supplied to the first transfer line and the third control signal SC3 of the high state is supplied to the second transfer line.

The second node controller NC2 of the kth stage STk includes sixth to seventeenth switching devices Tr6 to Tr17.

The sixth switching device Tr6 is turned on or off in response to the start pulse Vst and the second control signal SC2, and connects the control node QC to a second control signal SC2 input line when being turned on.

The seventh switching device Tr7 is turned on or off in response to the second control signal SC2, and connects the reset control node QD to the second control signal SC2 input line when being turned on.

The eighth switching device Tr8 is turned on or off in response to a voltage at the control node QC, and interconnects the reset control node QD and the discharging voltage line when being turned on.

The ninth switching device Tr9 is turned on or off in response to a voltage at the reset control node QD, and interconnects the control node QC and the discharging voltage line when being turned on.

The tenth switching device Tr10 is turned on or off in response to the voltage at the control node QC, and interconnects the reset node QB and the discharging voltage line when being turned on.

The eleventh switching device Tr11 is turned on or off in response to the voltage at the control node QC, and interconnects the set node Q and the discharging voltage line when being turned on.

The twelfth switching device Tr12 is turned on or off in response to the voltage at the set node Q, and interconnects the control node QC and the discharging voltage line when being turned on.

The thirteenth switching device Tr13 is turned on or off in response to the voltage at the set node Q, and interconnects the reset control node QD and the discharging voltage line when being turned on.

The fourteenth switching device Tr14 is turned on or off in response to the voltage at the reset control node QD, and interconnects the set node Q and the discharging voltage line when being turned on.

The fifteenth switching device Tr15 is turned on or off in response to the voltage at the reset control node QD, and interconnects the reset node QB and the discharging voltage line when being turned on.

The sixteenth switching device Tr16 is turned on or off in response to the voltage at the reset node QB, and interconnects the control node QC and the discharging voltage line when being turned on.

The seventeenth switching device Tr17 is turned on or off in response to the voltage at the reset node QB, and interconnects the reset control node QD and the discharging voltage line when being turned on.

In this manner, the sixth to seventeenth switching devices Tr6 to Tr17 of the second node controller NC2 can control the control node QC and reset control node QD and stabilize a driven state among the set node Q, reset node QB, control node QC and reset control node QD.

The scan pulse output unit SC of the kth stage STk includes a scan pull-up switching device Us and a scan pull-down switching device Ds.

The scan pull-up switching device Us is turned on or off in response to the voltage at the set node Q, and interconnects any one of a plurality of clock transfer lines which transfer a plurality of clock pulses with different phases, respectively, and a kth gate line when being turned on.

The scan pull-down switching device Ds is turned on or off in response to the voltage at the reset node QB, and interconnects the discharging voltage line and the kth gate line when being turned on.

The carry pulse output unit CO of the kth stage STk includes a carry pull-up switching device Uc and a carry pull-down switching device Dc.

The carry pull-up switching device Uc is turned on or off in response to the voltage at the set node Q, and interconnects any one of the clock transfer lines and the (k−1)th stage and (k+1)th stage when being turned on.

The carry pull-down switching device Dc is turned on or off in response to the voltage at the reset node QB, and interconnects the discharging voltage line and the (k−1)th stage and (k+1)th stage when being turned on.

The all-drive signal output unit SO of the kth stage STk includes an all-drive pull-up switching device Ua and an all-drive pull-down switching device Da.

The all-drive pull-up switching device Ua is turned on or off in response to the voltage at the control node QC, and interconnects an all-drive clock transfer line which transfers the all-drive clock pulse CLK_A and the kth gate line when being turned on.

The all-drive pull-down switching device Da is turned on or off in response to the voltage at the reset control node QD, and interconnects the discharging voltage line and the kth gate line when being turned on. This all-drive pull-down switching device Da contributes to stabilization of the set node Q and control node QC.

Figure 4:
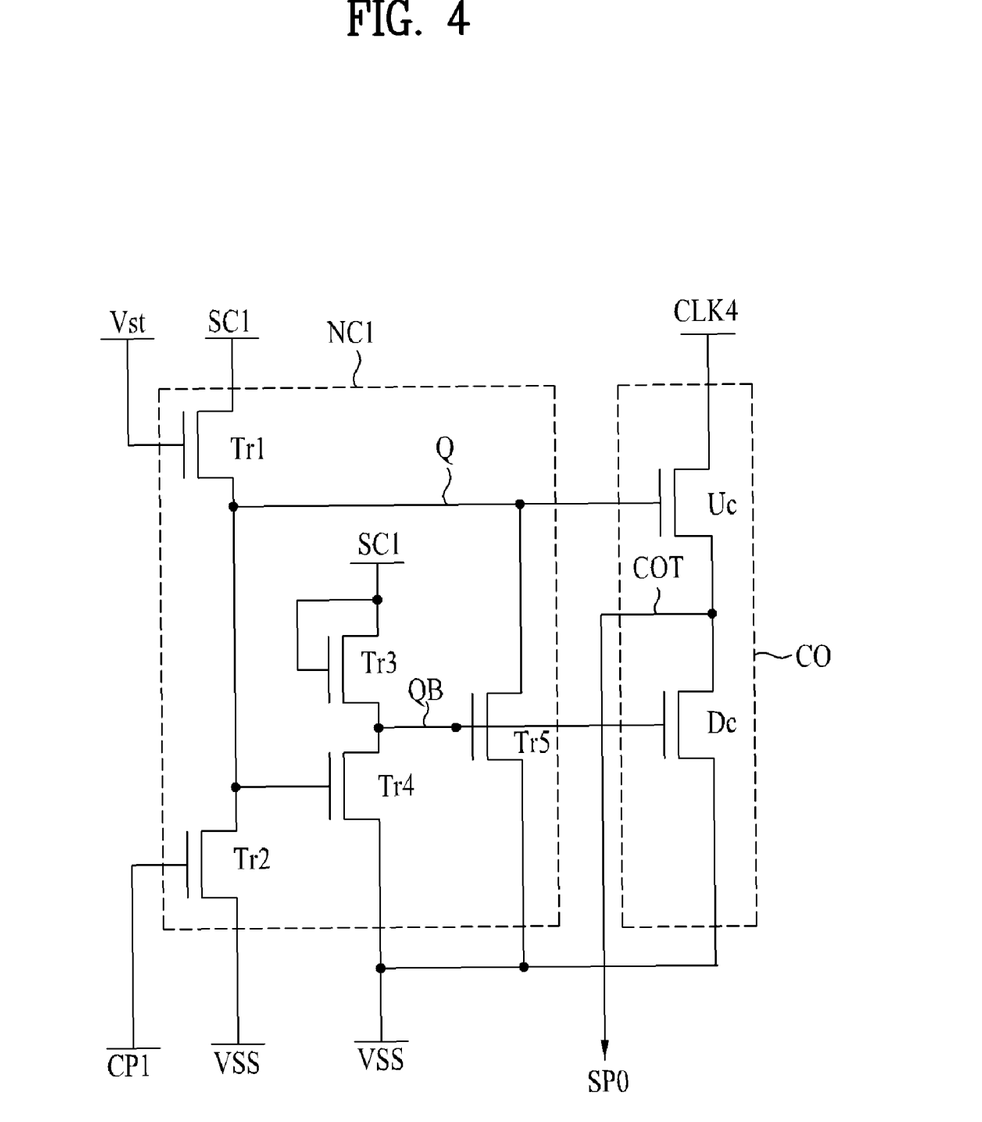
FIG. 4 is a circuit diagram of an upper dummy stage in FIG. 1.

FIG. 4 is a circuit diagram of the upper dummy stage ST0 in FIG. 1.

As shown in FIG. 4, the upper dummy stage ST0 is substantially the same in configuration as the above-stated kth stage STk, with the exception that it does not include the second node controller NC2, all-drive signal output unit SO and scan pulse output unit SC. Also, because there is no stage upstream from the upper dummy stage ST0, the start pulse Vst is supplied to the gate electrode of the first switching device Tr1 of the upper dummy stage ST0 instead of the carry pulse.

Similarly, the lower dummy stage STn+1 is substantially the same in configuration as the above-stated kth stage STk, with the exception that it does not include the second node controller NC2, all-drive signal output unit SO and scan pulse output unit SC. Also, because there is no stage downstream from the lower dummy stage STn+1, the start pulse Vst is supplied to the gate electrode of the second switching device Tr2 of the lower dummy stage STn+1 instead of the carry pulse.

Hereinafter, the operation of the shift register with the above-stated configuration will be described in detail with reference to FIG. 2 and FIG. 3.

First, in the first drive period AD1, the start pulse Vst which assumes the high state for the first time is outputted. This start pulse Vst is supplied to the gate electrode of the first switching device Tr1 of the upper dummy stage ST0, the gate electrode of the second switching device Tr2 of the lower dummy stage STn+1 and the gate electrode of the sixth switching device Tr6 of each of the first to nth stages ST1 to STn.

The upper dummy stage ST0 is set by the start pulse Vst, the lower dummy stage STn+1 is reset by the start pulse Vst, and the control node QC of each of the first to nth stages ST1 to STn is charged by the start pulse Vst.

Here, a description will be given of an operation of the kth stage STk in the first drive period AD1.

When the start pulse Vst is supplied to the gate electrode of the sixth switching device Tr6, the sixth switching device Tr6 is turned on. Then, the second control signal SC2 of the high state is supplied to the control node QC through the turned-on sixth switching device Tr6 so as to charge the control node QC. At this time, the all-drive pull-up switching device Ua, eighth switching device Tr8, tenth switching device Tr10 and eleventh switching device Tr11, connected to the charged control node QC through the gate electrodes thereof, are turned on.

Then, the discharging voltage VSS is supplied to the set node Q through the turned-on eleventh switching device Tr11. As a result, the set node Q is discharged, and the carry pull-up switching device Uc, scan pull-up switching device Us and fourth switching device Tr4, connected to the discharged set node Q through the gate electrodes thereof, are all turned off.

Also, the discharging voltage VSS is supplied to the reset node QB through the turned-on tenth switching device Tr10. As a result, the reset node QB is discharged, and the fifth switching device Tr5, sixteenth switching device Tr16, seventeenth switching device Tr17, carry pull-down switching device Dc and scan pull-down switching device Ds, connected to the discharged reset node QB through the gate electrodes thereof, are all turned off.

Meanwhile, because there is no scan pulse from the (k+1)th stage in the first drive period AD1, the second switching device Tr2 remains turned on. Also, since the first control signal SC1 is maintained in the low state, the third switching device Tr3 also remains turned off.

Next, a description will be given of an operation in the second drive period AD2.

In the second drive period AD2, the all-drive clock pulse CLK_A is maintained in the high state. This all-drive clock pulse CLK_A of the high state is supplied to the drain electrode of the all-drive pull-up switching device Ua which is kept turned on. At this time, the voltage at the control node QC is bootstrapped by a parasitic capacitor between the gate electrode of the all-drive pull-up switching device Ua connected to the floating control node QC and the drain electrode of the all-drive pull-up switching device Ua. As a result, the all-drive pull-up switching device Ua is almost completely turned on, and the all-drive clock pulse CLK_A is outputted through the turned-on all-drive pull-up switching device Ua. The all-drive clock pulse CLK_A is supplied to the kth gate line through the scan output terminal SOT. The all-drive clock pulse CLK_A supplied to the kth gate line is the very all-drive signal AP.

In this manner, the first to nth stages ST1 to STn simultaneously output the all-drive signals AP in the second drive period AD2 so as to supply them to the first to nth gate lines, respectively. Accordingly, in the second drive period AD2, the first to nth gate lines are driven at the same time.

On the other hand, the first control signal SC1 is changed from the low state to the high state from a period A immediately following the second drive period AD2, thereby causing the third switching device Tr3 of the kth stage STk to be turned on, so that the first control signal SC1 of the high state is supplied to the reset node QB through the turned-on third switching device Tr3. As a result, the reset node QB is charged.

Next, a description will be given of an operation in the initial period SD1.

In the initial period SD1, the start pulse Vst which assumes the high state for the second time is outputted. This start pulse Vst is also supplied to the gate electrode of the first switching device Tr1 of the upper dummy stage ST0, the gate electrode of the second switching device Tr2 of the lower dummy stage STn+1 and the gate electrode of the sixth switching device Tr6 of each of the first to nth stages ST1 to STn.

The upper dummy stage ST0 is set by the start pulse Vst, the lower dummy stage STn+1 is reset by the start pulse Vst, and the control node QC of each of the first to nth stages ST1 to STn is discharged by the start pulse Vst and the second control signal SC2 of the low state.

Here, a description will be given of an operation of the upper dummy stage ST0 in the initial period SD1.

When the start pulse Vst is supplied to the gate electrode of the first switching device Tr1 so as to turn on the first switching device Tr1, the first control signal SC1 of the high state is supplied to the set node Q through the turned-on first switching device Tr1, thereby causing the set node Q to be charged. As a result, the carry pull-up switching device Uc and fourth switching device Tr4, connected to the charged set node Q through the gate electrodes thereof, are both turned on. Meanwhile, since there is no carry pulse from the first stage ST1 in this period, the second switching device Tr2 remains turned off.

At this time, the discharging voltage VSS is supplied to the reset node QB through the turned-on fourth switching device Tr4. Also supplied to the reset node QB is the first control signal SC1 of the high state outputted through the third switching device Tr3 which is kept turned on. In this manner, in the initial period SD1, two opposite voltages are simultaneously supplied to the reset node QB. However, because the area of the fourth switching device Tr4 is designed to be larger than that of the third switching device Tr3, the reset node QB is discharged by the discharging voltage VSS supplied by the fourth switching device Tr4. Accordingly, the fifth switching device Tr5 and carry pull-down switching device Dc, connected to the discharged reset node QB through the gate electrodes thereof, are turned off.

A description will hereinafter be given of an operation of the kth stage STk in the initial period SD1.

Because the second control signal SC2 is maintained in the low state in the initial period SD1, the second control signal SC2 of the low state is supplied to the control node QC through the sixth switching device Tr6 turned on by the start pulse Vst in the initial period SD1. The control node QC is discharged by the second control signal SC2 of the low state. At this time, the all-drive pull-up switching device Ua, eighth switching device Tr8, tenth switching device Tr10 and eleventh switching device Tr1, connected to the discharged control node QC through the gate electrodes thereof, are all turned off. Accordingly, from this initial period SD1, the all-drive pull-up switching device Ua of the kth stage STk does not function. That is, from this period, the kth stage STk generates the scan pulse and carry pulse. This will hereinafter be described in association with the first stage ST1 as an example.

In a setup period TS, the fourth clock pulse CLK4 is supplied to the drain electrode of the turned-on carry pull-up switching device Uc of the above-stated upper dummy stage ST0. At this time, the voltage at the set node Q is bootstrapped by a parasitic capacitor between the gate electrode of the carry pull-up switching device Uc connected to the floating set node Q and the drain electrode of the carry pull-up switching device Uc. As a result, the carry pull-up switching device Uc is almost completely turned on, and the fourth clock pulse CLK4 is outputted through the turned-on carry pull-up switching device Uc. The fourth clock pulse CLK4 is supplied to the first stage ST1 through the carry output terminal COT. The fourth clock pulse CLK4 supplied to the gate electrode of the first switching device Tr1 of the first stage ST1 is the very upper dummy carry pulse CP0.

The first stage ST1 supplied with the upper dummy carry pulse CP0 from the upper dummy stage ST0 is set, and the operation of the first stage ST1 will hereinafter be described in detail.

The first switching device Tr1 of the first stage ST1, supplied with the upper dummy carry pulse CP0 through the gate electrode thereof, is turned on, and the first control signal SC1 of the high state is supplied to the set node Q through the turned-on first switching device Tr1. As a result, the fourth switching device Tr4, twelfth switching device Tr12, thirteenth switching device Tr13, carry pull-up switching device Uc and scan pull-up switching device Us, connected to the set node Q through the gate electrodes thereof, are all turned on.

The discharging voltage VSS is supplied to the reset node QB through the turned-on fourth switching device Tr4 so as to discharge the reset node QB. Accordingly, the fifth switching device Tr5, carry pull-down switching device Dc, scan pull-down switching device Ds, sixteenth switching device Tr16 and seventeenth switching device Tr17, connected to the discharged reset node QB through the gate electrodes thereof, are all turned off. Meanwhile, because the area of the fourth switching device Tr4 of the first stage ST1 is designed to be larger than that of the third switching device Tr3 of the first stage ST1 as described in the configuration of the upper dummy stage ST0, the reset node QB is kept discharged.

On the other hand, the discharging voltage VSS is supplied to the control node QC and reset control node QD respectively through the turned-on twelfth and thirteenth switching devices Tr12 and Tr13, so that the voltages at the control node QC and reset control node QD are stabilized by the discharging voltage VSS.

Next, a description will be given of an operation in a first period T1.

In the first period T1, the first clock pulse CLK1 is supplied to the drain electrode of the turned-on carry pull-up switching device Uc of the first stage ST1 and the drain electrode of the turned-on scan pull-up switching device Us of the first stage ST1. At this time, the voltage at the set node Q is bootstrapped by a parasitic capacitor between the gate electrode of the carry pull-up switching device Uc connected to the floating set node Q and the drain electrode of the carry pull-up switching device Uc and a parasitic capacitor between the gate electrode of the scan pull-up switching device Us connected to the floating set node Q and the drain electrode of the scan pull-up switching device Us. As a result, the carry pull-up switching device Uc and the scan pull-up switching device Us are almost completely turned on, and the first clock pulse CLK1 is outputted through the turned-on carry pull-up switching device Uc and outputted through the turned-on scan pull-up switching device Us.

The first clock pulse CLK1 from the carry pull-up switching device Uc is supplied to the second stage ST2 and upper dummy stage ST0 through the carry output terminal COT. Also, the first clock pulse CLK1 from the scan pull-up switching device Us is supplied to the first gate line through the scan output terminal SOT.

The first clock pulse CLK1 outputted through the carry output terminal COT is the very first carry pulse CP1, and the first clock pulse CLK1 outputted through the scan output terminal SOT is the very first scan pulse SP 1.

In the first period T1, the first carry pulse CP1 outputted from the first stage ST1 is supplied to the gate electrode of the second switching device Tr2 of the upper dummy stage ST0 and the gate electrode of the first switching device Tr1 of the second stage ST2. Accordingly, in this first period T1, the upper dummy stage ST0 is reset and the second stage ST2 is set.

Next, a detailed description will be given of the reset operation of the first stage ST1.

The first stage ST1 is reset by the second carry pulse CP2 outputted from the second stage ST2. That is, this second carry pulse CP2 is supplied to the gate electrode of the second switching device Tr2 of the first stage ST1. As a result, the second switching device Tr2 is turned on, and the discharging voltage VSS is supplied to the set node Q through the turned-on second switching device Tr2 so as to discharge the set node Q. Accordingly, the fourth switching device Tr4, carry pull-up switching device Uc, scan pull-up switching device Us, twelfth switching device Tr12 and thirteenth switching device Tr13, connected to the discharged set node Q through the gate electrodes thereof, are all turned off. As the fourth switching device Tr4 is turned off, the reset node QB is changed from its discharged state to its charged state by the first control signal SC1 of the high state supplied by the turned-on third switching device Tr3, and the fifth switching device Tr5, carry pull-down switching device Dc, scan pull-down switching device Ds, sixteenth switching device Tr16 and seventeenth switching device Tr17, connected to the charged reset node QB through the gate electrodes thereof, are all turned on. The discharging voltage VSS is supplied to the set node Q through the turned-on fifth switching device Tr5, so that the set node Q is more stably maintained in its discharged state. Also, the discharging voltage VSS is outputted to the dummy stage ST0 through the turned-on carry pull-down switching device Dc.

On the other hand, the discharging voltage VSS is supplied to the control node QC through the turned-on sixteenth switching device Tr16, so that the voltage at the control node QC is stabilized by the discharging voltage VSS. Also, the discharging voltage VSS is supplied to the reset control node QD through the turned-on seventeenth switching device Tr17, so that the voltage at the reset control node QD is stabilized by the discharging voltage VSS.

In this manner, the control node QC and the reset control node QD are stabilized by the discharging voltage VSS supplied by the twelfth and thirteenth switching devices Tr12 and Tr13 in the set operation of the stage, and by the discharging voltage VSS supplied by the sixteenth and seventeenth switching devices Tr16 and Tr17 in the reset operation of the stage. Accordingly, the all-drive pull-up switching device Ua connected to the control node QC and the all-drive pull-down switching device Da connected to the reset control node QD are stably maintained in their turned-off state for the scan period SD.

As described above, in the present invention, the gate lines are driven simultaneously in the all-drive period AD and sequentially in the scan period SD.

FIG. 5 is a waveform diagram of various signals which are supplied to the shift register of FIG. 1 in reverse driving and all-drive signals and scan pulses which are outputted therefrom.

As shown in FIG. 5, in the present invention, in order to reversely drive the shift register, the phases of the first and third control signals SC1 and SC3 in the forward driving are inverted and the first and third control signals SC1 and SC3 of the inverted phases are supplied. At this time, the first to fourth clock pulses CLK1 to CLK4 are also supplied in the opposite order to that in the forward driving so that the scan pulses can be reversely supplied to the gate lines.

In the case where the shift register of the present invention as stated above is used in an organic electroluminescence display device, the all-drive period AD may be utilized for compensation for a threshold voltage of a driving switching device. Also, in the case where the shift register of the present invention is used in a liquid crystal display device, the all-drive period AD may be utilized as a period for which black data is supplied to all pixels.

Figure 6:
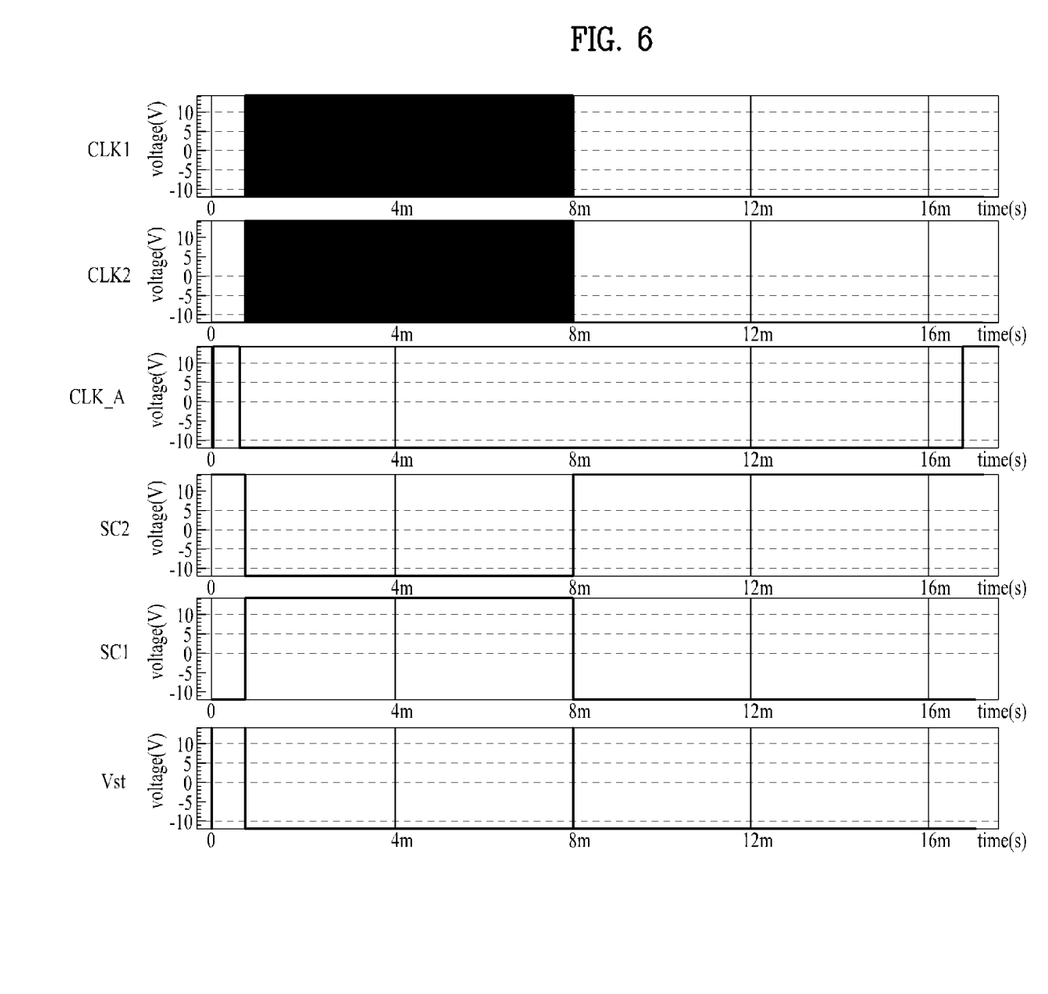
FIG. 6 is a simulated waveform diagram of various signals which are supplied to a shift register of the present invention.
Figure 7:
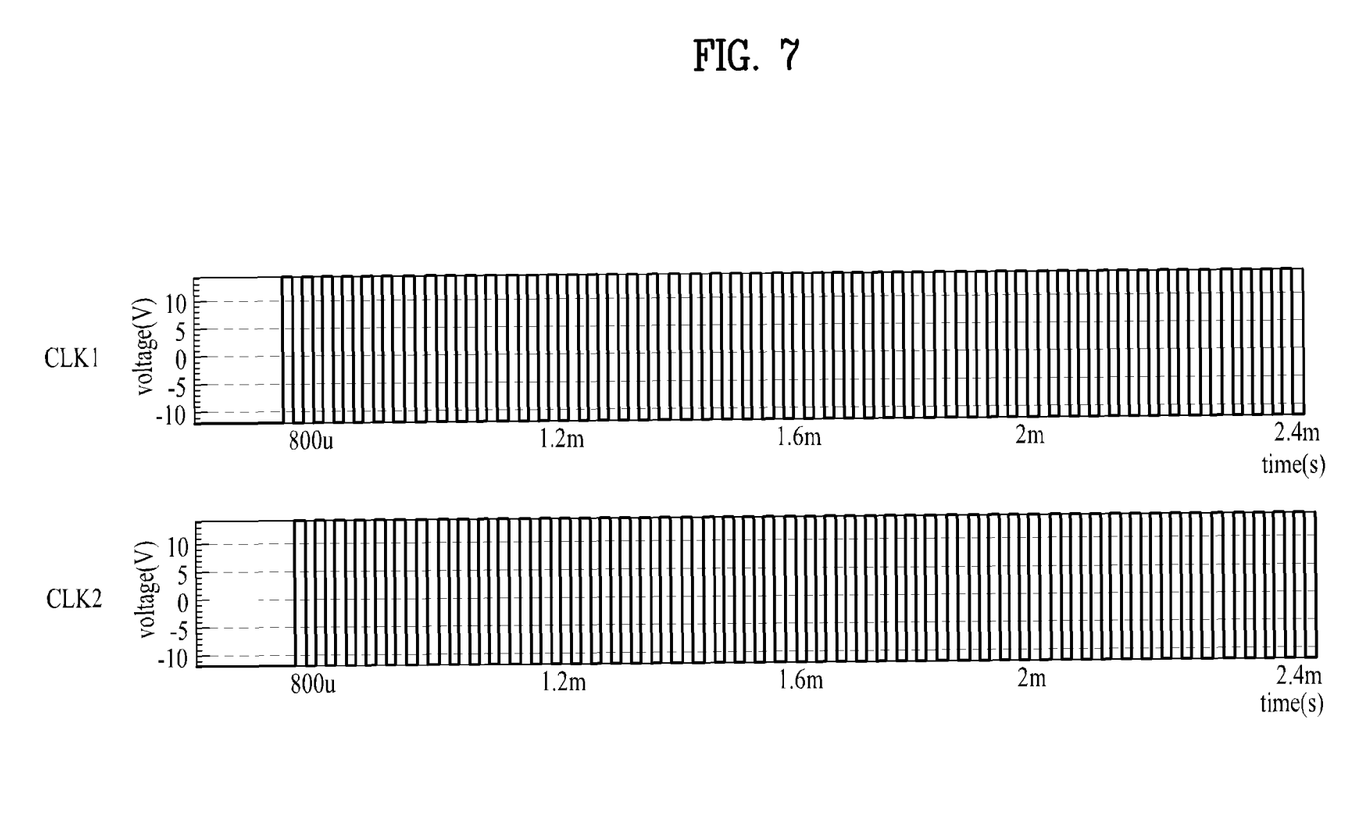
FIG. 7 is an enlarged view of first and second clock pulses in FIG. 6.

FIG. 6 is a simulated waveform diagram of various signals which are supplied to the shift register of the present invention, and FIG. 7 is an enlarged view of first and second clock pulses in FIG. 6.

Figure 8:
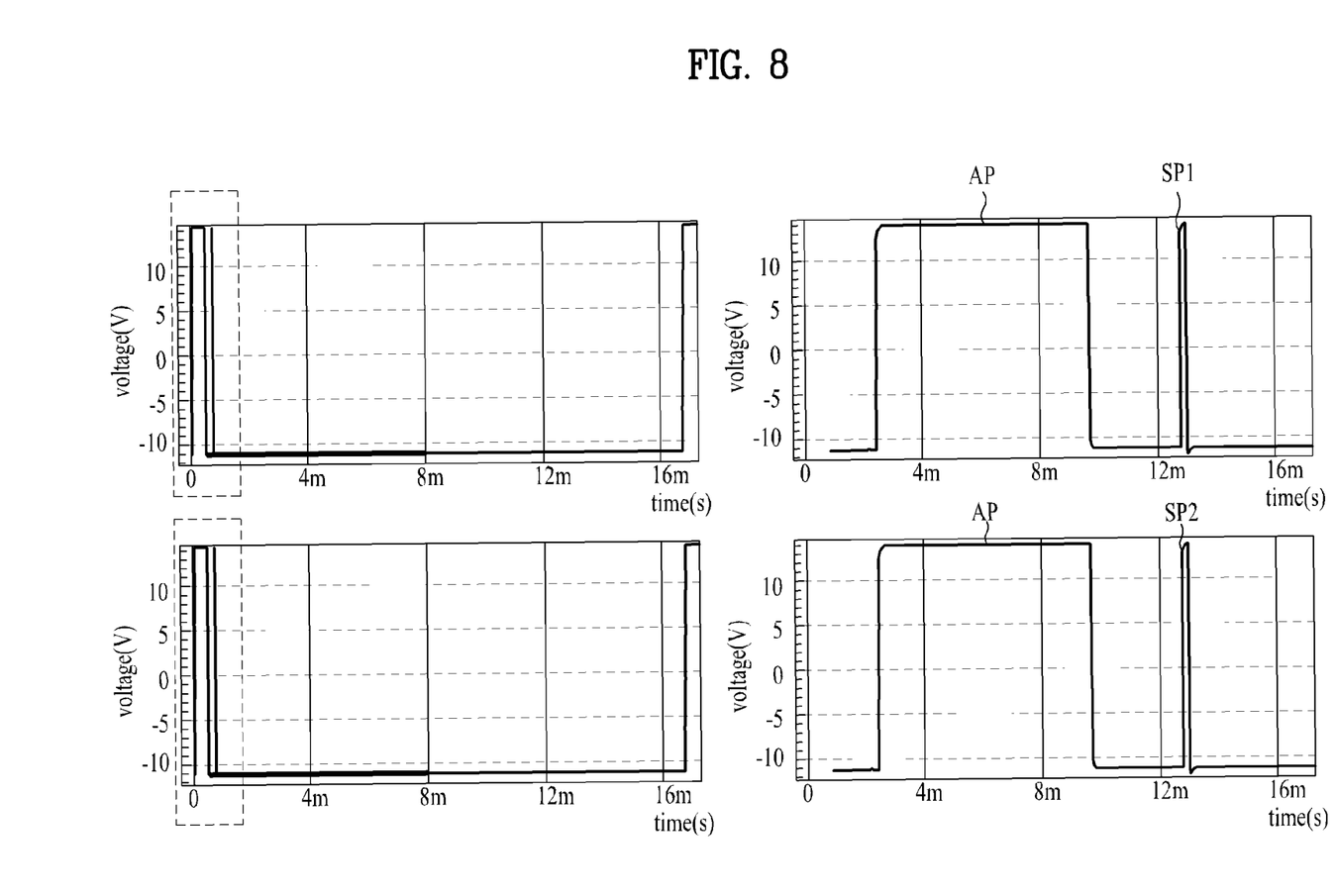
FIG. 8 is a simulated waveform diagram of all-drive signals and scan pulses which are outputted from first and second stages of the present invention.

FIG. 8 is a simulated waveform diagram of all-drive signals and scan pulses which are outputted from the first and second stages of the present invention, in which the right signal waveforms are enlarged versions of portions in dotted boxes of the left signal waveforms.

Figure 9:
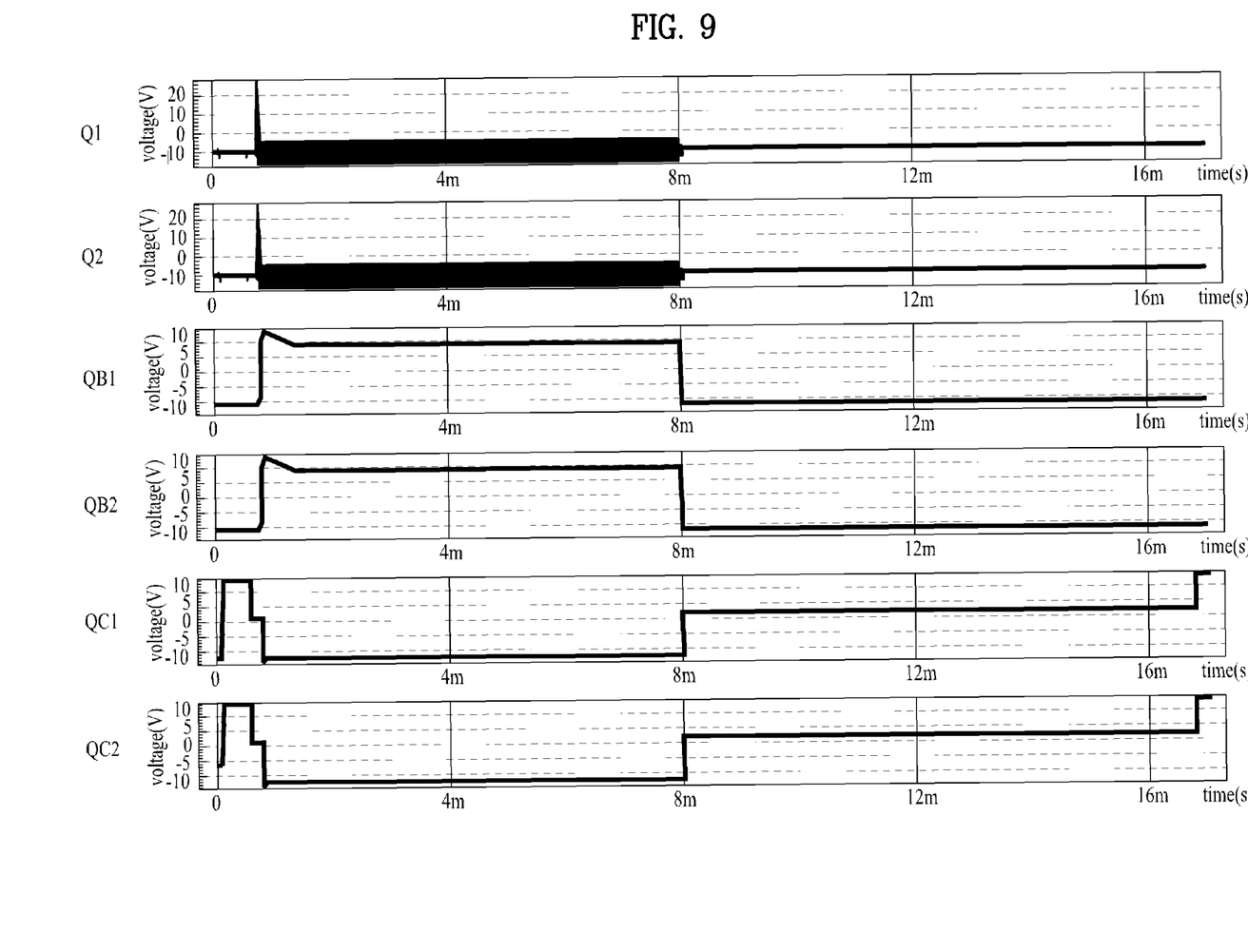
FIG. 9 is a simulated waveform diagram of voltages at a set node, reset node and control node of the present invention.

FIG. 9 is a simulated waveform diagram of voltages at the set node, reset node and control node of the present invention, in which Q1 means the set node of the first stage, Q2 means the set node of the second stage, QB1 means the reset node of the first stage, QB2 means the reset node of the second stage, QC1 means the control node of the first stage, and QC2 means the control node of the second stage.

As apparent from the above description, a shift register according to the present invention has effects as follows.

The shift register of the present invention can simultaneously drive gate lines for an all-drive period and sequentially drive the gate lines for a scan period by changing the driving direction of the gate lines.

In the case where the shift register of the present invention is used in an organic electroluminescence display device, the all-drive period may be utilized for compensation for a threshold voltage of a driving switching device. Also, in the case where the shift register of the present invention is used in a liquid crystal display device, the all-drive period may be utilized as a period for which black data is supplied to all pixels. In addition, the driving direction of the gate lines may be changed depending on the display direction of an image.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially outputting scan pulses, wherein each of the stages comprises:

a scan pulse output unit controlled according to voltage states of a set node and reset node for outputting a corresponding one of the scan pulses and supplying the corresponding scan pulse to a corresponding gate line;

a carry pulse output unit controlled according to the voltage states of the set node and reset node for outputting a carry pulse and supplying it to an upstream one of the stages and a downstream one of the stages;

a first node controller for controlling the voltage states of the set node and reset node according to a carry pulse from the upstream stage, a carry pulse from the downstream stage and a first control signal externally supplied thereto;

an all-drive signal output unit controlled according to voltage states of a control node and reset control node for outputting an all-drive signal and supplying it to the corresponding gate line; and a second node controller for controlling the voltage states of the control node and reset control node according to the voltage state of the set node, the voltage state of the reset node, and a start pulse and second control signal externally supplied thereto.

2. The shift register according to claim 1, wherein:

the first control signal is maintained in a low state for an all-drive period and in a high state for a scan period; and the second control signal is maintained in the high state for the all-drive period and in the low state for the scan period.

3. The shift register according to claim 2, wherein the first node controller of a kth one of the stages comprises:
- a first switching device turned on or off in response to a scan pulse from a (k−1)th one of the stages, the first switching device interconnecting a first transfer line and the set node when being turned on;
- a second switching device turned on or off in response to a scan pulse from a (k+1)th one of the stages, the second switching device interconnecting a second transfer line and the set node when being turned on;
- a third switching device turned on or off in response to the first control signal from a first control line, the third switching device interconnecting the first control line and the reset node when being turned on;
- a fourth switching device turned on or off in response to a voltage at the set node, the fourth switching device interconnecting the reset node and a discharging voltage line when being turned on, the discharging voltage line transferring a discharging voltage; and
- a fifth switching device turned on or off in response to a voltage at the reset node, the fifth switching device interconnecting the set node and the discharging voltage line when being turned on.

4. The shift register according to claim 3, wherein:
the first control signal is supplied to the first transfer line and the discharging voltage is supplied to the second transfer line, in forward driving where the stages are driven to output the scan pulses sequentially from a first stage to a last stage; and
the discharging voltage is supplied to the first transfer line and the first control signal is supplied to the second transfer line, in reverse driving where the stages are driven to output the scan pulses reverse-sequentially from the last stage to the first stage.

5. The shift register according to claim 3, wherein the second node controller of the kth stage comprises:
- a sixth switching device turned on or off in response to the start pulse and the second control signal, the sixth switching device connecting the control node to a second control signal input line when being turned on;
- a seventh switching device turned on or off in response to the second control signal, the seventh switching device connecting the reset control node to the second control signal input line when being turned on;
- an eighth switching device turned on or off in response to a voltage at the control node, the eighth switching device interconnecting the reset control node and the discharging voltage line when being turned on;
- a ninth switching device turned on or off in response to a voltage at the reset control node, the ninth switching device interconnecting the control node and the discharging voltage line when being turned on;
- a tenth switching device turned on or off in response to the voltage at the control node, the tenth switching device interconnecting the reset node and the discharging voltage line when being turned on;
- an eleventh switching device turned on or off in response to the voltage at the control node, the eleventh switching device interconnecting the set node and the discharging voltage line when being turned on;
- a twelfth switching device turned on or off in response to the voltage at the set node, the twelfth switching device interconnecting the control node and the discharging voltage line when being turned on;
- a thirteenth switching device turned on or off in response to the voltage at the set node, the thirteenth switching device interconnecting the reset control node and the discharging voltage line when being turned on;
- a fourteenth switching device turned on or off in response to the voltage at the reset control node, the fourteenth switching device interconnecting the set node and the discharging voltage line when being turned on;
- a fifteenth switching device turned on or off in response to the voltage at the reset control node, the fifteenth switching device interconnecting the reset node and the discharging voltage line when being turned on;
- a sixteenth switching device turned on or off in response to the voltage at the reset node, the sixteenth switching device interconnecting the control node and the discharging voltage line when being turned on; and
- a seventeenth switching device turned on or off in response to the voltage at the reset node, the seventeenth switching device interconnecting the reset control node and the discharging voltage line when being turned on.

6. The shift register according to claim 3, wherein the scan pulse output unit of the kth stage comprises:
- a scan pull-up switching device turned on or off in response to the voltage at the set node, the scan pull-up switching device interconnecting any one of a plurality of clock transfer lines and a kth gate line when being turned on, the clock transfer lines transferring a plurality of clock pulses with different phases, respectively; and
- a scan pull-down switching device turned on or off in response to the voltage at the reset node, the scan pull-down switching device interconnecting the discharging voltage line and the kth gate line when being turned on.

7. The shift register according to claim 3, wherein the carry pulse output unit of the kth stage comprises:
- a carry pull-up switching device turned on or off in response to the voltage at the set node, the carry pull-up switching device interconnecting any one of a plurality of clock transfer lines and the (k−1)th stage and (k+1)th stage when being turned on, the clock transfer lines transferring a plurality of clock pulses with different phases, respectively; and
- a carry pull-down switching device turned on or off in response to the voltage at the reset node, the carry pull-down switching device interconnecting the discharging voltage line and the (k−1)th stage and (k+1)th stage when being turned on.

8. The shift register according to claim 3, wherein the all-drive signal output unit of the kth stage comprises:
- an all-drive pull-up switching device turned on or off in response to the voltage at the control node, the all-drive pull-up switching device interconnecting an all-drive clock transfer line and a kth gate line when being turned on, the all-drive clock transfer line transferring an all-drive clock pulse; and
- an all-drive pull-down switching device turned on or off in response to the voltage at the reset control node, the all-drive pull-down switching device interconnecting the discharging voltage line and the kth gate line when being turned on.

9. The shift register according to claim 8, wherein:
the start pulse is maintained in a high state for a first drive period, of the first drive period and a second drive period constituting the all-drive period, and for an initial period, of the initial period and an actual scan period constituting the scan period; and
the all-drive clock pulse is maintained in the high state for the second drive period.

* * * * *